United States Patent [19]

Matsunaga et al.

[11] Patent Number: 4,928,157
[45] Date of Patent: May 22, 1990

[54] PROTECTION DIODE STRUCTURE

[75] Inventors: Taira Matsunaga; Takashi Kimura, both of Yokohama, Japan

[73] Assignee: Kabushiki Kaisha Toshiba, Kawasaki, Japan

[21] Appl. No.: 333,370

[22] Filed: Apr. 5, 1989

[30] Foreign Application Priority Data

Apr. 8, 1988 [JP] Japan .................................. 63-86622

[51] Int. Cl.$^5$ ............................................. H01L 29/78
[52] U.S. Cl. ................................ 357/23.13; 357/23.3; 357/23.4; 357/23.8; 357/23.11
[58] Field of Search .................... 357/23.13, 23.3, 23.4, 357/23.11, 23.8

[56] References Cited

U.S. PATENT DOCUMENTS

| | | | |
|---|---|---|---|
| 4,044,373 | 8/1977 | Nomiya et al. | 357/41 |
| 4,400,711 | 8/1983 | Avery | 357/43 |
| 4,402,003 | 8/1983 | Blanchard | 357/43 |
| 4,595,941 | 6/1986 | Avery | 357/43 |
| 4,803,541 | 2/1989 | Kouda | 357/68 |
| 4,831,424 | 5/1989 | Yoshida | 357/23.13 |

FOREIGN PATENT DOCUMENTS 0192359 9/1983 Japan ....................... 357/23.3

*Primary Examiner*—Martin H. Edlow
*Assistant Examiner*—Stephen D. Meier
*Attorney, Agent, or Firm*—Finnegan, Henderson, Farabow, Garrett and Dunner

[57] ABSTRACT

A protection diode structure for a MOS transistor which includes a semiconductor substrate layer and a gate electrode insulated from the semiconductor substrate layer and in which a driving voltage is applied therebetween to create an inversion layer in an operating mode, includes a first semiconductor layer, a second semiconductor layer formed in the first semiconductor layer and connected to the gate electrode, and a third semiconductor layer formed to surround the first semiconductor layer, uniformly separated from the second layer, and connected to the semiconductor substrate layer, wherein the first and second semiconductor layers constitute a first diode having a breakdown voltage greater than the driving voltage and less than the gate withstand voltage of the MOS transistor, and the first and third semiconductor layers constitute a second diode having a breakdown voltage less than the gate withstand voltage of the MOS transistor. In this protection diode structure, the junction area of the second diode is set larger than that of the first diode by uniformly separating the third semiconductor layer from the second semiconductor layer. The semiconductor substrate layer and first semiconductor layer are formed of a first conductivity type and the second and third semiconductor layers are formed of a second conductivity type. Thus, the first PN junction diode is reversely biased by application of the drive voltage and the second PN junction diode is forwardly biased by application of the drive voltage.

6 Claims, 2 Drawing Sheets

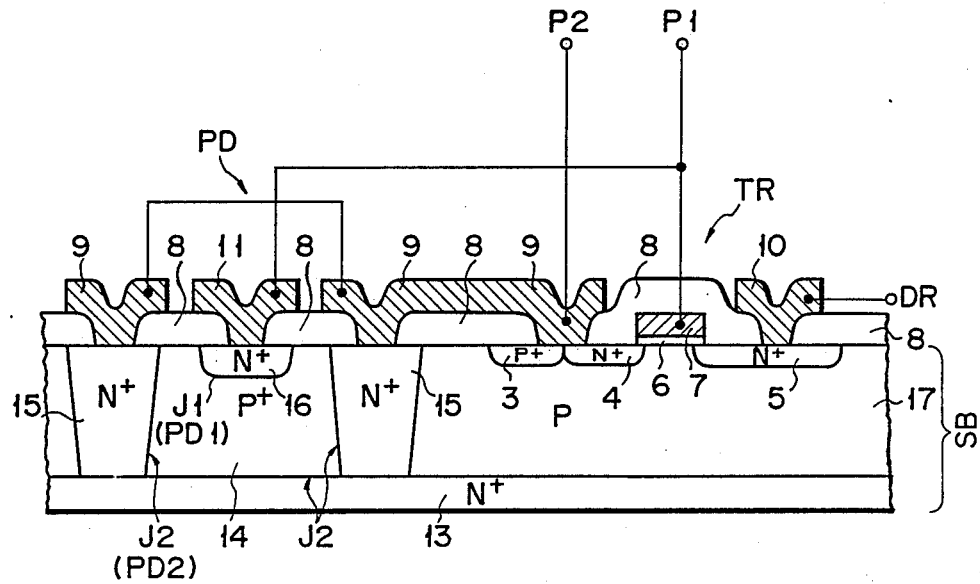
F I G. 2

PROTECTION DIODE STRUCTURE

BACKGROUND OF THE INVENTION

1. Field of the Invention

This invention generally relates to a semiconductor device, and more particularly to a protection diode structure for protecting an insulated gate type semiconductor device.

2. Description of the Related Art

FIG. 1 shows an n-channel MOS transistor as an example of an insulated gate type semiconductor device. The MOS transistor has n-type source and drain regions 4 and 5 formed in the surface area of p-type semiconductor substrate 1, oxide film 6 formed on that portion of semiconductor substrate 1 which lies between source and drain regions 4 and 5, and gate electrode 7 formed on oxide film 6. In the operating condition, a drive voltage is applied between gate electrode 7 and each of semiconductor substrate 1 and source region 4 to set the potential of gate electrode 7 higher than those of semiconductor substrate 1 and source region 4 so that an inversion region is created as a channel in the surface area of semiconductor substrate 1 between source and drain regions 4 and 5. The gate withstand voltage of the MOS transistor is set to be equal to the maximum voltage at which oxide film 6 can withstand the rupture. In a case where the drive voltage is set less than 20 volts, oxide film 6 is set to a thickness of, for example, approximately 500 Å such that a gate withstand voltage of approximately 50 V can be obtained.

It is generally known that such a MOS transistor is easily affected by static electricity. In most cases, electrostatically generated voltages are higher than the gate withstand voltage. Therefore, the rupture of oxide film 6 may be caused by the voltage applied thereto and the MOS transistor will be destroyed permanently. PN junction diodes D1 and D2 shown in FIG. 1 are serially connected between gate electrode 7 and semiconductor substrate 1 in order to protect the MOS transistor from permanent destruction. PN junction diodes D1 and D2 are forwardly biased and reversely biased respectively in a case where the potential of gate electrode 7 is set higher than that of semiconductor substrate 1, and reversely biased and forwardly biased respectively in a case where the potential of gate electrode 7 is set lower than that of semiconductor substrate 1. When a voltage higher than the withstand voltage of the MOS transistor is applied between gate electrode 7 and semiconductor substrate 1, one of the PN junction diodes which is reversely biased is temporarily broken down. At this time, a breakdown current flows via PN junction diodes D1 and D2 between gate electrode 7 and semiconductor substrate 1, thereby protecting oxide film 6 from rupture.

The input capacitance of the MOS transistor is determined by a stray capacitance of series-connected PN junction diodes D1 and D2 and a capacitance between gate electrode 7 and semiconductor substrate 1. Since the capacitance between gate electrode 7 and semiconductor substrate 1 is in parallel relation with respect to the stray capacitance of PN junction diodes D1 and D2, the input capacitance of the MOS transistor increases by adding PN junction diodes D1 and D2. Increasing in the capacitance of the MOS transistor increases noise factor NF and lowers the operation speed.

In order to solve the above problem, it is considered to reduce the PN junction area of the PN junction diode, for example. However, when the PN junction area is reduced, the withstand voltage of the PN junction diode is undesirably lowered. Further, it is also considered to sufficiently reduce the impurity concentration of one of p- and n-type semiconductor layers constituting the PN junction diode. In this case, the breakdown voltage of the PN junction diode is raised, reducing the margin between the breakdown voltage of the PN junction diode and the gate withstand voltage of the MOS transistor. When the margin is thus reduced, there is a possibility that the MOS transistor is not protected by the PN junction diode. If a significantly large breakdown current flows in the PN junction diode, the voltage across the PN junction diode becomes higher than the gate withstand voltage of the MOS transistor because of the presence of a small resistance of the broken-down PN junction diode. In this way, the MOS transistor may be damaged.

SUMMARY OF THE INVENTION

An object of this invention is to provide a protection diode structure for an insulated gate type semiconductor device to protect the insulated gate type semiconductor device at a high reliability and improve the high frequency characteristic thereof.

The object can be attained by a protection diode structure for an insulated gate type semiconductor device which includes a semiconductor substrate layer of a first conductivity type and a gate electrode formed above and insulated from the semiconductor substrate layer and in which a driving voltage is applied between the gate electrode and the semiconductor substrate layer to create an inversion layer of a second conductivity type in the surface area of the semiconductor substrate layer in an operating mode; comprising a first semiconductor layer of the first conductivity type; a second semiconductor layer of the second conductivity type formed to in the surface area of the first semiconductor layer and connected to the gate electrode; and a third semiconductor layer of the second conductivity type formed to surround the first semiconductor layer, substantially uniformly separated from the second semiconductor layer, and connected to the semiconductor substrate layer; wherein the first and second semiconductor layers constitute a first PN junction diode having a breakdown voltage greater than the driving voltage and less than the gate withstand voltage of the insulated gate type semiconductor device, and the first and third semiconductor layers constitute a second PN junction diode having a breakdown voltage less than the gate withstand voltage of the insulated gate type semiconductor device and having a PN junction area larger than the first PN junction diode.

In the above protection diode, the first and second PN junction diodes are respectively biased in forward and reverse directions or reverse and forward directions depending on the voltage which is applied between the gate electrode and the semiconductor substrate layer and irrespective of the operation mode. When the voltage exceeds the breakdown voltage of the reversely-biased PN junction diode, a breakdown current will flow between the gate electrode and the semiconductor substrate layer via the first, second and third semiconductor substrate layers, thereby preventing the dielectric breakdown of the insulated gate type semiconductor device. Since the first and second PN junction diodes are connected in series between the gate electrode and the semiconductor substrate layer, the stray capacitance of the protected diode structure is largely dependent on a smaller one of the stray capacitances of the first and second PN junction diodes and is set to a value close to the smaller stray capacitance. The stray capacitances of the first and second PN junction diodes are set to be smaller when the PN junction diode is reversely biased than when it is forwardly biased. In this case, the stray capacitance is set to be smaller as the junction area is made smaller. The first and second PN junction diodes are respectively biased reversely and forwardly by the drive voltage applied in the operating mode. The third semiconductor layer is substantially uniformly separated from the first semiconductor layer in order to prevent the damage of the PN junction due to concentration of the breakdown current, and in this case, the junction area of the second junction diode may become larger than that of the first PN junction diode. However, even in such a case, the stray capacitance of the protection diode structure will not significantly increase. In other words, the stray capacitance of the protection diode structure may be reduced in comparison with the case where the second PN junction diode having a larger junction area than the first PN junction diode is reversely biased by the drive voltage. As a result, the capacitance of the insulated gate type semiconductor device is kept to be small in the operating mode, permitting the insulated gate type semiconductor device to operate in a higher frequency range.

BRIEF DESCRIPTION OF THE DRAWINGS

FIG. 2 is a cross sectional view of a protection diode structure according to one embodiment of this invention;

DETAILED DESCRIPTION OF THE PREFERRED EMBODIMENTS

Figure 1:
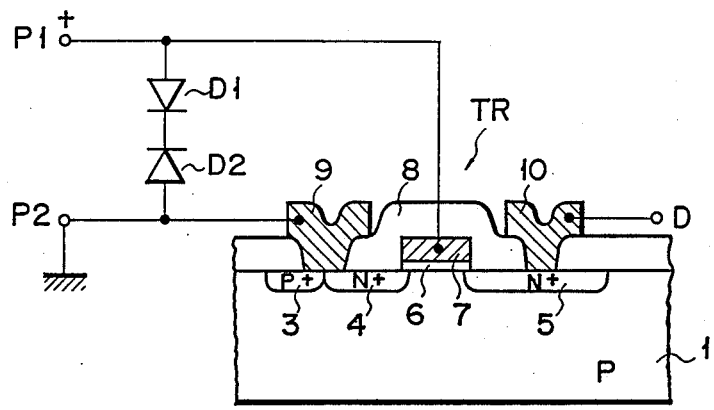
FIG. 1 shows the construction of the conventional MOS transistor as an example of an insulated gate type semiconductor device.
Figure 3:
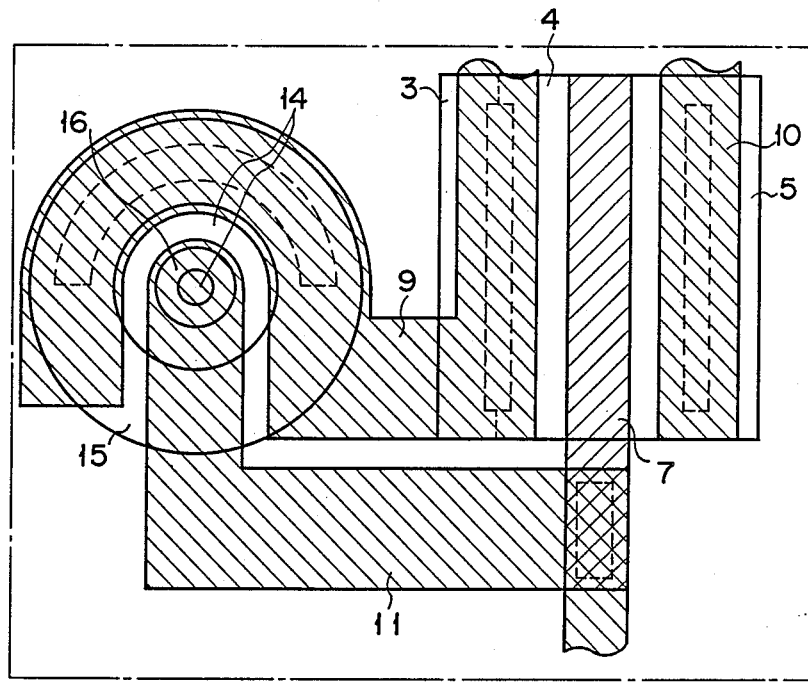
FIG. 3 is a top view of the protection diode structure of FIG. 2.

There will now be described a protection diode structure according to one embodiment of this invention with reference to FIGS. 2 and 3. FIG. 2 is a cross sectional view of protection diode structure PD and FIG. 3 is a top view of the protection diode structure PD. Protection diode structure PD is used to protect N-channel MOS transistor TR formed by commonly using multi-layered substrate SB. Multi-layered substrate SB includes n+-type semiconductor layer 13, and p-type semiconductor layer 17 formed to cover the surface of semiconductor layer 13. MOS transistor TR includes n+-type source and drain regions 4 and 5 formed in the surface area of p type semiconductor layer 17, oxide film 6 formed on the surface of that portion of semiconductor layer 17 which lies between source and drain regions 4 and 5, and gate electrode 7 formed on oxide film 6. Wiring electrodes 9 and 10 shown in FIG. 2 are used as the source and drain electrodes of MOS transistor TR. Wiring electrode 9 is formed in ohmic contact with source region 4 and p+-type contact region 3 formed in the surface area of semiconductor layer 17, and wiring electrode 10 is formed in ohmic contact with drain region 5. Input terminals P1 and P2 are used to receive the drive voltage applied in the operating mode, and are respectively connected to gate electrode 7 and wiring electrode 9. The potential of gate electrode 7 is set higher than that of semiconductor layer 17 by the drive voltage. At this time, an n-type inversion layer is created as a channel in the surface area of that portion of semiconductor layer 17 which lies between source and drain regions 4 and 5.

Protection diode structure PD includes annular n+-type semiconductor layer 15 formed in the surface area of semiconductor layer 17, p+-type semiconductor region 14 formed in the surface area of semiconductor layer 17 and surrounded by semiconductor region 15, and n+-type 16 formed in the surface area of semiconductor region 14 and uniformly separated from semiconductor region 15. The entire bottoms of semiconductor regions 14 and 15 contacts the semiconductor layer 13. Semiconductor regions 16 and 14 constitute PN junction diode PD1 having a breakdown voltage higher than the drive voltage applied to MOS transistor TR and lower than the gate withstand voltage of MOS transistor TR, and semiconductor regions 14 and 15 constitute PN junction diode PD2 having a breakdown voltage lower than the withstand voltage of MOS transistor TR and a PN junction area larger than PN junction diode PD1. Gate electrode 7 is connected to wiring electrode 11 which is formed in ohmic contact with semiconductor region 16, and wiring electrode 9 is formed in ohmic contact with semiconductor region 15. The exposed portions of PN junction diodes PD1 and PD2 and MOS transistor TR are covered with insulating layer 8.

In manufacturing PN junction diodes PD1 and PD2 and MOS transistor TR, semiconductor substrate SB is formed by the chemical vapor deposition process. In this process, an epitaxial layer containing boron with impurity concentration of $2 \times 10^{15}$ cm$^{-3}$ is formed as semiconductor layer 13 by the chemical vapor deposition to a thickness of 6 μm on the surface of semiconductor layer 17 containing antimony with impurity concentration of $3 \times 10^{18}$ cm$^{-3}$. For formation of n+-type semiconductor region 15 and p+-type semiconductor region 14, photolithographic and diffusion processes are effected. That is, semiconductor region 15 is formed by forming a mask pattern on semiconductor region 17 by the photolithographic method, ion-implanting phosphorus of a dose amount of $2 \times 10^{15}$ cm$^{-2}$ into the exposed portion of semiconductor layer 17 under the acceleration voltage of 50 KeV, and annealing semiconductor substrate SB at a temperature of 1100° C. in nitrogen atmosphere for 12 hours so as to diffuse the implanted phosphorus. Further, semiconductor region 14 is formed by forming a mask pattern on semiconductor region 17 by the photolithographic method, ion-implanting boron of a dose amount of $8 \times 10^{13}$ cm$^{-2}$ into semiconductor layer 17 under the acceleration voltage of 40 KeV, and annealing semiconductor substrate SB at a temperature of 1100° C. in nitrogen atmosphere for 15 hours so as to diffuse the implanted boron in semiconductor layer 17. Oxide film 6 is formed by oxidizing the surface of semiconductor layer 17 after semiconductor regions 14 and 15 are formed, and the thickness thereof is set at 500 Å. Gate electrode 7 is formed by depositing molybdenum silicide (MoSi) on oxide film 6 to a thickness of 4000 Å, and partly removing the thus deposited molybdenum silicide layer. The threshold voltage of MOS transistor TR is determined by the amount of impurity previously doped in that portion of semiconductor layer 17 which lies under oxide film 6. In a case where it is required to reduce a leakage current, semiconductor regions of a relatively high impurity concentration are formed in those portions of semiconductor layer 17 which lie adjacent to source and drain regions 4 and 5. The ion-implantation process for forming source and drain regions 4 and 5 is effected after gate electrode 7 is formed. In this process, phosphorus of a dose amount of $2 \times 10^{14}$ cm$^{-2}$ is ionimplanted into semiconductor layer 17 under the acceleration voltage of 60 KeV. The contact resistances between source region 4 and source electrode 9 and between drain region 5 and drain electrode 10 are reduced by ion-implanting arsenide of a dose amount of $5 \times 10^{15}$ cm$^{-2}$ into regions 4 and 5 under the acceleration voltage of 40 KeV. In the ion-implantation process for forming contact region 3, boron of a dose amount of $5 \times 10^{15}$ cm$^{-2}$ is ion-implanted into semiconductor layer 17 under the acceleration voltage of 40 KeV. Insulating layer 8 is formed by depositing a silicon oxide film to a thickness of 8000 Å on the exposed portion of the semiconductor structure by the chemical vapor deposition after the ion-implanting process for formation of regions 4, 5 and 16. The annealing process for regions 4, 5 and 16 is effected by subjecting semiconductor substrate SB to a heat treatment at a temperature of 1000° C. in the nitrogen atmosphere for approximately 30 minutes after formation of insulating layer 8. Wiring electrodes 9, 10 and 11 are formed by partly removing portions of insulating layer 8 which lie on regions 3, 4, 5, 15 and 16 to form contact holes, depositing an aluminum layer on the exposed portions of regions 3, 4, 5, 15 and 16 and insulating layer 8, and then patterning the aluminum layer.

In the protection diode of this embodiment, the area of PN junction J2 can be made larger than that of PN junction J1 by uniformly separating semiconductor region 16 from semiconductor region 15. PN junction diodes PD1 and PD2 may be respectively biased reversely and forwardly according to a drive voltage applied thereto via input terminals P1 and P2. In this case, the stray capacitance of PN junction diode PD1 is smaller than that of PN junction diode PD2. The stray capacitance obtained at this time is smaller than that of either PN junction diode PD1 or PD2 obtained when PN junction diodes PD1 and PD2 are respectively biased forwardly and reversely according to a drive voltage applied thereto via input terminals P1 and P2. For example, if the areas of PN junctions J1 and J2 are set to 314 μm$^2$ and 707 μm$^2$, respectively, and the impurity concentration of semiconductor region 14 is set to $3 \times 10^{17}$ cm$^{-3}$, the protection diode structure will have a stray capacitance of 0.323 PF. In this case, if the conductivity types of regions 14, 15 and 16 are changed so as to respectively bias PN junction diodes PD1 and PD2 in forward and reverse directions according to application of the drive voltage, the stray capacitance of the protection diode structure increases to 0.487 PF. In this way, the protection diode structure of this embodiment can be used to reliably protect the MOS transistor and improve the high frequency characteristic of the MOS transistor.

Figure 4:
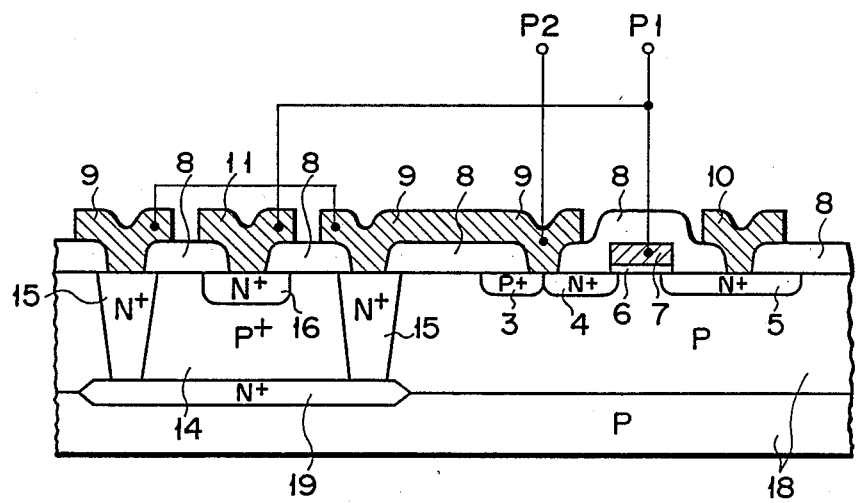
FIG. 4 is a modification of the protection diode structure of FIG. 2.

This invention is not limited to the above embodiment, and can be variously modified without departing from the technical scope thereof. In the above embodiment, semiconductor layers 13 and 15 are used to electrically isolate semiconductor region 14 from semiconductor layer 17. However, as shown in FIG. 4, it is possible to replace semiconductor layer 13 by semiconductor layer 19 embedded in semiconductor substrate 18 serving as semiconductor layer 17, for example. Further, MOS transistor TR may be formed as a dual gate MOS transistor.

What is claimed is:

1. A protection diode structure for an insulated gate type semiconductor device which includes a semiconductor substrate layer of a first conductivity type and a gate electrode formed above and insulated from said semiconductor substrate layer and in which a driving voltage is applied between said gate electrode and said semiconductor substrate layer to create an inversion layer of a second conductivity type in the surface area of said semiconductor substrate layer in an operating mode, comprising:
   a first semiconductor layer of the first conductivity type;
   a second semiconductor layer of the second conductivity type formed in the surface area of said first semiconductor layer and connected to said gate electrode; and
   a third semiconductor layer of the second conductivity type formed to surround said first semiconductor layer, substantially uniformly separated from said second semiconductor layer, and connected to said semiconductor substrate layer;
   wherein said first and second semiconductor layers constitute a first PN junction diode having a breakdown voltage higher than the driving voltage and lower than the gate withstand voltage of said insulated gate type semiconductor device, and said first and third semiconductor layers constitute a second PN junction diode having a breakdown voltage lower than the gate withstand voltage of said insulated gate type semiconductor device and having a PN junction area larger than said first PN junction diode.

2. A protection diode structure according to claim 1, wherein said first and third semiconductor layers are formed in the surface area of said semiconductor substrate layer.

3. A protection diode structure according to claim 2, wherein said semiconductor substrate layer is formed on a fourth semiconductor layer of the second conductivity type, and said third semiconductor layer is formed in contact with said fourth semiconductor layer to electrically isolate said first semiconductor layer from said semiconductor substrate layer.

4. A protection diode structure according to claim 2, which further includes an embedded layer of a second conductivity type formed in said semiconductor substrate layer, and in which said third semiconductor layer contacts said embedded layer to electrically isolate said first semiconductor layer from said semiconductor substrate layer.

5. A protection diode structure according to claim 2, wherein said insulated gate type semiconductor device is a MOS transistor having source and drain regions of the second conductivity type formed in the surface area of said semiconductor substrate layer.

6. A protection diode structure according to claim 5, further including a contact region of the first conductivity type formed in the surface area of said semiconductor substrate layer and a wiring electrode formed in contact with said source and contact regions and said third semiconductor layer.

* * * * *